United States Patent [19]

Kabelac et al.

[11] 4,441,166
[45] Apr. 3, 1984

[54] PASSIVE ANNIHILATOR FOR CONTIGUOUS-DISK BUBBLE DEVICES

[75] Inventors: William J. Kabelac, Morgan Hill; Ian L. Sanders, Sunnyvale, both of Calif.

[73] Assignee: International Business Machines Corporation, Armonk, N.Y.

[21] Appl. No.: 381,473

[22] Filed: May 24, 1982

[51] Int. Cl.³ .............................................. G11C 19/08
[52] U.S. Cl. .......................................... 365/36; 365/1
[58] Field of Search ................................ 365/1, 36, 41

[56] References Cited

U.S. PATENT DOCUMENTS 4,086,571  4/1978  Bullock .................................. 365/36

FOREIGN PATENT DOCUMENTS 6481  1/1980  European Pat. Off. ............. 365/36

Primary Examiner—James W. Moffitt
Attorney, Agent, or Firm—Joseph E. Kieninger

[57] ABSTRACT

A passive annihilator for ion-implanted contiguous-disk bubble devices has a deep cusp formed by two narrow, non-implanted regions. This annihilator has a maximum bias field margin and drive field margin, and is compatible with other components which comprise a functional ion-implanted contiguous-disk bubble device.

8 Claims, 2 Drawing Figures

PASSIVE ANNIHILATOR FOR CONTIGUOUS-DISK BUBBLE DEVICES

DESCRIPTION

1. Technical Field

This invention relates to ion-implanted contiguous-disk bubble devices, and more particularly, to a passive bubble annihilator.

2. Background Art

Bubble devices require the use of an annihilator to dispose of unwanted bubbles. There are two types of annihilator. One type is an active annihilator which uses the magnetic field produced by carrying a current conductor positioned across a bubble propagation path to annihilate the bubbles. The passive annihilator is the other type, which annihilates bubbles without the use of a separate current carrying conductor.

An active bubble annihilator for use in ion-implanted contiguous-disk bubble devices is disclosed in U.S. Pat. No. 4,086,571. In this structure the annihilation function is accomplished by passing a current pulse through a hair-pin shaped conductor lying across the ion-implanted bubble propagation pattern. The current direction is such that the magnetic field generated by the conductor opposes the magnetization of the bubble. Thus, a bubble, under the influence of the field from the annihilator conductor is collapsed, providing the current magnitude in the conductor is sufficiently large. The disadvantage of using an active annihilator is the complexity that it adds to the bubble chip and the associated chip packaging due to the presence of conductors, the increased power dissipated on the chip due to the current pulse in the conductor, and the need for support circuits to drive the conductor lines. Furthermore, as bubble devices are scaled to make use of materials supporting smaller bubble diameters, the magnitude of the current density in the conductor required to accomplish annihilation increases. Passive annihilators, on the other hand, are quite independent of bubble diameter and can be readily scaled for use with smaller bubble diameters.

A passive bubble annihilator for permalloy type bubble devices is described in the IBM Technical Disclosure Bulletin, Vol. 23, No. 8, January, 1981, page 3871. This annihilator includes a number of permalloy overlays which are not suitable for use in an ion-implanted contiguous disk bubble device because of the fundamental difference in the propagation mechanisms involved. Prior to this invention, a passive annihilator for contiguous-disk bubble devices was not available.

SUMMARY OF THE INVENTION

A passive annihilator for ion-implanted contiguous-disk bubble devices has a deep cusp formed by two narrow, non ion-implanted regions. The depth of the annihilator cusp is of the order of five times the depth of the propagation cusp adjacent thereto. In a typical ion-implanted contiguous-disk device using 1 μm diameter bubbles, the width of the narrow regions which form the annihilator cusp are less than 2.5 microns wide. A preferred width is 1.5 microns. In general, the preferred width is about 1.5 times the bubble diameter, so that in a 0.5 μm bubble device, the preferred width would be about 0.75 μm.

For a further understanding of this invention, and of the objects and advantages thereof, reference will be had to the following detailed description and to the accompanying drawings and to the appended claims wherein the specific embodiments of the invention are shown.

BRIEF DESCRIPTION OF THE DRAWINGS

The invention will now be described by way of example and reference to the accompanying drawings in which.

DESCRIPTION OF PREFERRED EMBODIMENTS

Figure 1:
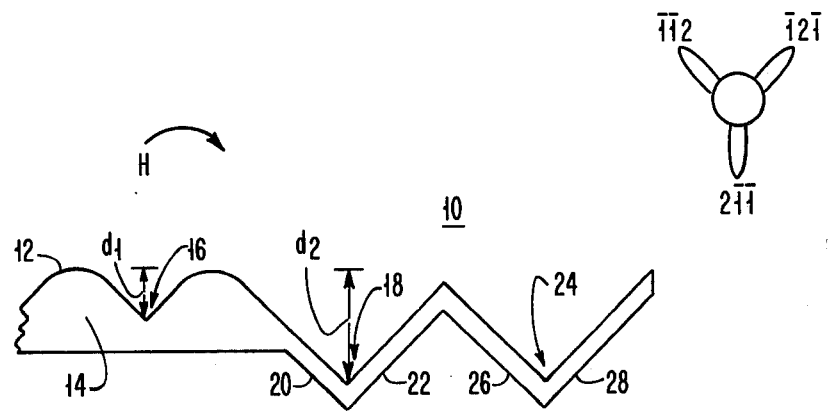
FIG. 1 is a top view of a preferred embodiment of a passive annihilator in accordance with this invention.

As shown in FIG. 1, in a preferred embodiment, the ion-implanted contiguous-disk bubble device 10 includes a first propagation path 12, for example, a write major loop. The first propagation path 12 has a non ion-implanted region 14 that contains a cusp 16 having a depth $d_1$. The passive annihilator consists of a deep cusp 18 formed by narrow non ion-implanted regions 20 and 22. Nonion-implanted region 20 is connected to cusp 16 of propagation path 12.

The depth of cusp 18 is $d_2$. The size of $d_2$ is of the order of five times the size of $d_1$. In general, depth of cusp 18 should be at least ten times the diameter of the bubble. For example, in a 1 μm diameter bubble device, the depth $d_2$ should be of the order of 10.0 μm. Deep cusp 24 is connected to deep cusp 18 by narrow non ion-implanted regions 20, 22, 26, and 28, which form deep cusps 18 and 24 are less than 2.5 microns wide. In a 1 μm diameter bubble device, a preferred width is 1.5 to 1.7 microns.

Bubbles propagating along the first propagation path 12 under the influence of a clockwise rotating drive field, propagate out of the cusp 16 into the annihilator cusp 18. The combination of the cusp depth $d_2$ and the narrowness of the nonion-implanted regions 20 and 22 provide a poor propagation path, thereby resulting in bubbles being unable to propagate out of the cusp 18. Experiments have shown that bubbles stranded on the narrow propagation path 20-22 are collapsed during the subsequent rotating field cycle, presumably due to the influence of an opposing charged-wall in the ion-implanted garnet drive layer as it sweeps past the bubble. The strength of the opposing charged-wall is sufficient to collapse the bubble over the operating field range of the device.

A cusp 24 is not necessary, but is used in a preferred embodiment to ensure the collapse of any bubble which may not have been collapsed in cusp 18, and that is propagated along region 26 into cusp 24. Additional deep cusps may be added beyond cusp 24.

The orientation of the annihilator cusp 18 with respect to the garnet crystallographic axes is shown in FIG. 1. This orientation maximizes the ability of the cusp 18 and 24 to annihilate the bubbles. In this orientation propagation path 12 is a strong bubble propagator and it exhibits a large operating bias field margins. This is because the strength of the driving charged-wall in the ion-implanted layer is maximized for path oriented such that one of the principle axes ($2\bar{1}\bar{1}$, $\bar{1}\bar{1}2$, $\bar{1}2\bar{1}$) is perpendicular to, and directed towards, the cusp of propagation path 12. For similar reasons, the strength of the opposing charge-wall which is responsible for collapsing bubbles in cusp 18, is also maximized for this orientation and, therefore, the annihilation mechanism is optimized. Although the annihilator can operate in other orientations, its bias field range will be less than that for the optimum configuration shown in FIG. 1.

Also, because the operation of the annihilator relies on the magnetic field from the opposing charged-wall in the ion-implanted layer, the annihilator disclosed here can be scaled for application in devices using smaller bubble diameters. This is because the strength of both the driving and opposing charged-walls increases as bubble size is reduced as a result of an increase in the saturation magnetization in the bubble device material. Thus, this annihilator can be used in higher density bubble devices with no loss of operating performance.

The angle of the cusps 18 formed by legs 20 and 22 and cusp 24 by legs 26 and 28 is of the order of 90 degrees. Other angles may be used, however, the operating bias field tolerance for an angle of 90 degrees is greater than 60 degrees is greater than 30 degrees. Thirty (30) degrees results in the poorest operating tolerance and 90 degrees in the largest operating tolerance. Similarly, if the angle is increased larger than 90 degrees, the performance falls off as the angle becomes larger than 90 degrees.

EXAMPLE 1

A chip using 1 μm diameter bubbles having the non ion-implanted pattern shown in FIG. 1 was provided. The angle of legs 20 and 22 form an angle of 90 degrees for the cusp 18. Similarly, legs 26 and 28 formed an angle of 90 degrees for the cusp 24. The width of the regions 20, 22, 26, and 28 was 1.7 microns.

The depth of the cusp 18, $d_2$, was five times greater than the depth of for the cusp 16, $d_1$. With an in-plane rotating drive field magnitude of 50 to 60 oersteds and at a frequency of 200 kilohertz, the following data were obtained:

| Chip Temp | Major Loop Bias Field Margin | Annihilator Bias Field Margin |
|---|---|---|
| 30° C. | 295-343 Oe (15%) | 300-343 Oe (13.5%) |
| 50° C. | 279-318 Oe (13%) | 281-318 Oe (12.5%) |
| 70° C. | 255-288 Oe (12%) | 258-288 Oe (11.0%) |
| Minor Loop Margin:- | | |
| 30° C. 296-327 Oe (10%) | | |

The annihilator margin encompasses virtually the entire major loop operating range. An overall bias field margin of 80-10% is generally considered sufficient for a bubble device. Consequently each component of the bubble chip should exhibit a bias field margin of at least 10% over the operating drive field and temperature range of the device. ideally, it is desirable that the annihilator should operate over the complete bias field range of the major loop propagation paths. A reduction of the width of non ion-implanted regions 20, 22, 26 and 28 from 1.7 μm to 1.5 μm has been shown to enable the few oersteds at the lower edge of the major loop bias field margin given in the above table to be obtained. Thus, the passive annihilator disclosed herein is compatible with overall chip operating tolerances.

Figure 2:
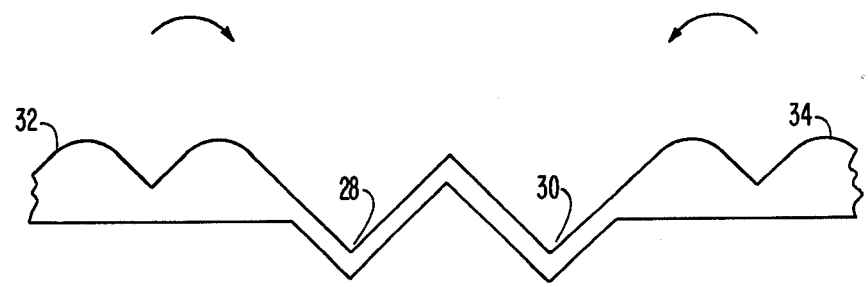
FIG. 2 is a schematic view of the second preferred embodiment of a passive annihilator for devices utilizing bi-directional bubble propagation in accordance with this invention.

As shown in FIG. 2, in another preferred embodiment, the passive annihilator is designed for bi-directional use, that is bubbles propagating from the propagation path 32 into cusp 28 will be annihilated with clockwise rotation, whereas bubbles on propagation track 34 would propagate with counterclockwise rotation into annihilator 30. Bi-directional bubble propagation is employed in major loop-minor loop bubble devices to improve performance since it reduces the time required to access data stored in the minor loops. The embodiment shown in FIG. 2 allows unwanted bubbles on an isolated path to be annihilated regardless of the sense of direction of bubble propagation.

Although a preferred embodiment of this invention has been described, it is understood that numerous variations may be made in accordance with the principles of this invention.

What is claimed is:

1. A passive annihilator for ion-implanted contiguous-disk bubble devices comprising:
   a non-implanted pattern having a plurality of first cusps and forming a propagation path, said first cusps having a first depth, and
   a narrow non-implanted region connected to said pattern to form a second cusp therebetween, said region having a width that provides a poor propagation path, said second cusp having a second depth that is of the order of at least four times the depth of said first cusps wherein the bubbles entering said second cusp have difficulty propagating out of said second cusp, and are collapsed during a subsequent rotating field cycle.

2. a passive annihilator as described in claim 1 wherein the angle of the second cusp is of the order of 80 to 135 degrees.

3. A passive annihilator as described in claim 2 wherein the angle of said second cusp is of the order of 90 degrees.

4. A passive annihilator as described in claim 1 wherein the depth of the second cusp is about five times the first cusps depth.

5. A passive annihilator as described in claim 1 wherein the width of said region is less than 2.5 microns.

6. A passive annihilator as described in claim 5 wherein the width of said region is of the order of 1.5 microns.

7. A passive annihilator as described in claim 1 wherein said region is aligned with a particular cyrstallographic orientation to provide a poor propagation track in said second cusp.

8. A passive annihilator for use with an ion-implanted contiguous-disk bubble device having a nonion-implanted pattern having a plurality of first cusps and forming a propagation path, said first cusps having a first depth, characterized in that the annihilator includes:
   a narrow non-implanted region connected to said pattern to form a second cusp therebetween, said region having a width that provides a poor propagation path, said second cusp having a second depth that is of the order of at least four times the depth of said first cusps wherein the bubbles entering said second cusp have difficulty propagating out of said second cusp, and are collapsed during a subsequent rotating field cycle.

* * * * *